(12) United States Patent
Turner et al.

(10) Patent No.: US 9,165,101 B2
(45) Date of Patent: *Oct. 20, 2015

(54) NETWORK SYNTHESIS DESIGN OF MICROWAVE ACOUSTIC WAVE FILTERS

(71) Applicant: RESONANT INC., Santa Barbara, CA (US)

(72) Inventors: Patrick J. Turner, Santa Barbara, CA (US); Richard N. Silver, San Francisco, CA (US); Balam Quitze Andres Willemsen Cortes, Lexington, MA (US); Kurt F. Raihn, Goleta, CA (US); Neal O. Fenzi, Santa Barbara, CA (US); Robert B. Hammond, Santa Barbara, CA (US)

(73) Assignee: RESONANT INC., Santa Barbara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/578,131

(22) Filed: Dec. 19, 2014

(65) Prior Publication Data

US 2015/0106072 A1 Apr. 16, 2015

Related U.S. Application Data

(63) Continuation of application No. 13/838,943, filed on Mar. 15, 2013, now Pat. No. 9,038,005.

(51) Int. Cl.
*G06F 17/50* (2006.01)
*H03H 9/46* (2006.01)
(Continued)

(52) U.S. Cl.
CPC .......... *G06F 17/505* (2013.01); *G06F 17/5036* (2013.01); *H03H 9/46* (2013.01); *H03H 9/465* (2013.01); *H03H 9/542* (2013.01); *H03H 9/6483* (2013.01)

(58) Field of Classification Search
CPC .................................................. G06F 17/5045
USPC ......................................................... 716/104
See application file for complete search history.

(56) References Cited

U.S. PATENT DOCUMENTS

| 1,795,204 A | 3/1931 | Espenschied |
| 1,989,545 A | 1/1935 | Cauer |

(Continued)

FOREIGN PATENT DOCUMENTS

WO WO 2007/073524 6/2007

OTHER PUBLICATIONS

Aeroflex, Application Note, Intermodulation Distortion, Part No. 46801, Issue 2, May 2004, (12 pages).

(Continued)

*Primary Examiner* — Suresh Memula
(74) *Attorney, Agent, or Firm* — Vista IP Law Group LLP

(57) ABSTRACT

Methods for the design of microwave filters comprises comprising preferably the steps of inputting a first set of filter requirements, inputting a selection of circuit element types, inputting a selection of lossless circuit response variables, calculating normalized circuit element values based on the input parameters, and generate a first circuit, insert parasitic effects to the normalized circuit element values of the first circuit, and output at least the first circuit including the post-parasitic effect circuit values. Additional optional steps include: requirements to a normalized design space, performing an equivalent circuit transformation, unmapping the circuit to a real design space, performing a survey, and element removal optimization. Computer implement software, systems, and microwave filters designed in accordance with the method are included.

24 Claims, 21 Drawing Sheets

(51) Int. Cl.
H03H 9/54 (2006.01)
H03H 9/64 (2006.01)

(56) References Cited

U.S. PATENT DOCUMENTS

| | | | |
|---|---|---|---|
| 5,905,418 | A | 5/1999 | Ehara et al. |
| 6,677,835 | B2 | 1/2004 | Noguchi et al. |
| 7,639,101 | B2 | 12/2009 | Tsuzuki et al. |
| 7,719,382 | B2 | 5/2010 | Tsuzuki et al. |
| 7,863,999 | B2 | 1/2011 | Tsuzuki et al. |
| 7,924,114 | B2 | 4/2011 | Tsuzuki et al. |
| 8,026,776 | B2 | 9/2011 | Ueda et al. |
| 8,063,714 | B2 | 11/2011 | Tsuzuki et al. |
| 8,063,717 | B2 | 11/2011 | Bradley et al. |
| RE43,958 | E | 2/2013 | Noguchi et al. |
| 2001/0052739 | A1 | 12/2001 | Milsom |
| 2009/0002102 | A1 | 1/2009 | Tsuzuki et al. |
| 2009/0121802 | A1* | 5/2009 | Tsuzuki et al. .............. 333/17.1 |
| 2012/0119847 | A1 | 5/2012 | Iwaki et al. |
| 2012/0293279 | A1 | 11/2012 | Gong et al. |
| 2013/0093538 | A1 | 4/2013 | Hirota et al. |

OTHER PUBLICATIONS

Amari, Synthesis of Cross-Coupled Resonator Filters Using an Analytical Gradient-Based Optimization Technique, IEEE Trans. Microwave Theory & Technique, Sep. 2000, vol. 48, No. 9, pp. 1559-1564.
Amari et al., In-Line Pseudoelliptic Band-Reject Filters with Nonresonating Notes and/or Phase Shifts, IEEE Transactions on Microwave Theory & Techniques, vol. 54, No. 1, Jan. 2006, pp. 428-436.
Anritsu, Intermodulation Distortion (IMD) Measurements Using the 37300 Se,ries Vector Network Analyzer, Application Note, Sep. 2000, Rev. A, pp. 1-12.
Dahm, et al., Analysis & Optimization of Intermodulation in High-T.Superconducting Microwave Filter Design, IEEE Transactions on Applied Superconductivity, vol. 8, No. 4, Dec. 1998, pp. 149-157.
Hey-Shipton, Efficient Computer Design of Compact Planar Band-Pass Filters Using Electrically Short Multiple Coupled Unes, 1999 IEEE MTT-S Int. Microwave Symp. Dig. (4 pages).
Hong, et al., Microstrip Filters for RF/Microwave Applications, John Wiley & Sons, Inc. 2001, Table of Contents, pp. 1-471.
Liang et al., HTS Microstrip Filters with Multiple Symmetric & Asymmetric Prescribed Transmission Zeros,1999, IEEE MTT-S Digest, pp. 1551-1554.
Tsuzuki, et al., Superconducting Filter for IMT-2000 Band, IEEE Transactions on Microwave Theory & Techniques, vol. 48, No. 12, Dec. 2000, pp. 2519-2525.
Wu, et al., New Cross-Coupled Microstrip Band Reject Filters, 2004IEEE MTT-S Digest, pp. 1597-1600.
U.S. Appl. No. 61/802,114, entitled Element Removal Design in Microwave Filters, Inventor: Neal Fenzi et al., filed Mar. 15, 2013.
Saboureau, Cedrick et al., Accurate Computer Aided Design of Interdigital Filters Applying a Coupling Identification Method, 2002 IEEE MTT-S International Microwave Symposium Digest (CAT. No. 02CH37278) IEEE Piscataway, NJ, USA; [IEEE MTT-S International Microwave Symposium], IEEE, Jun. 2, 2002, pp. 2089-2092, XPO32408674, DOI: 10.1109/mwsym.2002.1012281, ISBN: 978-0-7803-7239-3 (4pages).
Wang, Hualei et al., Design of narrow bandwidth elliptic-type SAW/BAW filters, Electronic Letters,May 10, 2012, vol. 48, No. 10 (2pages).
PCT International Search Report for PCT/US2014/029800, Applicant: Resonant LLC, Form PCT/ISA/210 and 220, dated Sep. 18, 2014 (7pages).
PCT Written Opinion of the International Search Authority for PCT/US2014/029800, Applicant: Resonant LLC, Form PCT/ISA/237, dated Sep. 18, 2014 (9pages).
Cameron, Richard et al., Microwave Filters for Communication Systems: Fundamentals, Designs and Applications, Wiley-Interscience (2007), Chapter 2, pp. 83-96.
Cameron, Richard et al., Microwave Filters for Communication Systems: Fundamentals, Designs and Applications, Wiley-Interscience (2007), Chapter 3, pp. 97-150.
Cameron, Richard et al., Microwave Filters for Communication Systems: Fundamentals, Designs and Applications, Wiley-Interscience (2007), Chapter 7, pp. 243-278.
Zobel, Otto J., Theory and Design of Uniform and Composite Electric Wave-filters, The Bell System Technical Journal, vol. II, No. 1 (Jan. 1923).
Campbell, G. A., Physical Theory of the Electric Wave Filter, The Bell System Technical Journal, vol. I, No. 2 (Nov. 1922).
Darlington, S., Synthesis of Reactance 4-poles which produce prescribed insertion loss characteristics, J. Math Phys, vol. 18, 1939, pp. 257-353.
Foster, R.M., A Reactance Theorem, Bell Syst. Tech. J., vol. 3, 1924, pp. 259-267.
Hashimoto, K., Surface Acoustic Wave Devices in Telecommunications: Modeling and Simulation, Springer (2000), pp. 149-161.
Ikata, O. et al., Development of Low-Loss Bandpass Filters Using Saw Resonators for Portable Telephones, 1992 Ultrasonics Symposium, pp. 111-115.
Kinsman, R.G., Crystal Filters: Design, Manufacture, and Application, John Wiley & Sons, pp. 37-105 and 117-155, (1987).
Mason, W.P., Electrical Wave Filters Employing Quartz Crystals as Elements, The Bell System Technical Journal (1934).
Matthaei, G.L. et al., Microwave Filters, Impedance-Matching Networks, and Coupling Structures, McGraw-Hill Book Company, pp. 95-97, 438-440 (1964).
Morgan, D., Surface Acoustic Wave Filters With Applications to Electronic Communications and Signal Processing, pp. 335-339, 352-354 (2007).
Van Dyke, K.S., Piezo-Electric Resonator and its Equivalent Network, Proc. IRE, vol. 16, 1928, pp. 742-764.
Zverev, A. I., Handbook of Filter Synthesis, John Wiley & Sons, pp. 414-498 (1967).

* cited by examiner

| Element | Ind (nH) |
|---------|----------|
| L1 | 9.05 |
| L2 | 1.43 |
| L3 | 0.38 |
| L4 | 11.93 |
| L5 | 0.09 |
| L6 | 63.42 |
| L7 | 7.18 |
| L8 | 0.21 |

| Element | Cap (pF) |
|---------|----------|
| C1 | 2.45 |
| C2 | 0.89 |
| C3 | 0.14 |

| Element | C0 (pF) | Freq (MHz) |
|---------|---------|------------|
| Res1 | 1.96 | 1858.13 |
| Res2 | 0.84 | 1825.00 |
| Res3 | 0.31 | 1881.19 |
| Res4 | 0.61 | 1831.00 |
| Res5 | 0.89 | 1910.00 |
| Res6 | 0.16 | 2150.00 |
| Res7 | 0.54 | 2032.00 |
| Res8 | 4.42 | 1797.00 |
| Res9 | 4.69 | 1852.36 |

Circuit Schematic Values of Figure 2

*FIG. 3*

Circuit Frequency Response Before ERO

| Element | CO (pF) | Freq (MHz) |
|---------|---------|------------|
| Res1    | 6.51    | 1854.78    |
| Res2    | 2.93    | 1792.20    |
| Res3    | 0.81    | 1877.00    |
| Res4    | 3.48    | 1800.00    |
| Res5    | 1.13    | 1866.30    |
| Res6    | 0.61    | 2151.57    |
| Res7    | 6.14    | 2026.79    |
| Res8    | 1.63    | 1806.38    |
| Res9    | 1.74    | 1867.06    |

Circuit Schematic Values of Figure 5

*FIG. 6*

| Resonator | C0 (pF) | Fres (MHz) |
|---|---|---|
| R1 | 0.951637 | 929.018 |
| R2 | 0.952398 | 870.206 |
| R3 | 0.974154 | 924.105 |
| R4 | 1.78885 | 787.066 |
| R5 | 4.5102 | 800.953 |
| R6 | 0.950074 | 947.936 |

*FIG. 18*

NETWORK SYNTHESIS DESIGN OF MICROWAVE ACOUSTIC WAVE FILTERS

RELATED APPLICATION DATA

This Application is a continuation of U.S. application Ser. No. 13/838,943, filed on Mar. 15, 2013. Priority is claimed pursuant to 35 U.S.C. §120 and any other applicable statute. The above-noted Patent Application is incorporated by reference as if set forth fully herein.

FIELD OF THE INVENTION

The present invention relates in general to microwave filters, and more particularly, to a method for improving microwave filter design, systems for implementation of the methods, and filters resulting therefrom.

RELATED CASE STATEMENT

This application is related to U.S. Pat. No. 7,719,382 B2, Tsuzuki et al., Low-Loss Tuneable Radio Frequency Filter", issued May 18, 2010, U.S. Pat. No. 7,639,101 B2, Tsuzuki et al., Low-Loss Tuneable Radio Frequency Filter, issued Dec. 29, 2009, U.S. Pat. No. 7,863,999 B2, Tsuzuki et al., Low-Loss Tuneable Radio Frequency Filter, issued Jan. 4, 2011, U.S. Pat. No. 8,063,714 B2, Tsuzuki et al., Low-Loss Tuneable Radio Frequency Filter, issued Nov. 22, 2011, U.S. Pat. No. 7,924,114 B2, Tsuzuki et al., Electrical Filters With Improved intermodulation Distortion, issued Apr. 12, 2011, and co-pending application Ser. No. 61/802,114, entitled "Element Removal Optimization in Microwave Filters", filed on Mar. 15, 2013, hereby incorporated by reference as if fully set forth herein.

BACKGROUND OF THE INVENTION

Frequency selective electrical filters for communications applications were developed beginning around 1910, for telegraphy and telephony uses, particularly for multiplexing and de-multiplexing of communication signal channels carried on long distance cables and wireless links. Later they were used for many other applications. Filter design methods, named "image" or "image parameter" design methods, were developed by G. A. Campbell (Campbell 1922) and A. Zobel (Zobel 1924) of Bell Telephone Laboratories, among others. These filter circuits utilized circuit elements including inductors, capacitors, and transformers. In the 1920's, a new circuit element began to be used in some electrical signal filters, the acoustic wave (AW) resonator, specifically the quartz bulk acoustic wave resonator; whose electrical circuit equivalent was first described by Van Dyck (Van Dyck 1928); its equivalent circuit has two resonances closely spaced in frequency, the "resonance" and the "anti-resonance". The image filter design methods were applied to filter circuits utilizing these quartz resonators, and two acoustic wave filter circuit types resulted, "ladder" and "lattice" acoustic wave filter designs (Mason 1934). Beginning ~1990 thin film surface acoustic wave (SAW) resonators and bulk acoustic wave resonators (BAW) were developed and began to be used in microwave AW ladder filter designs. The image designed acoustic wave ladder bandpass filter in SAW and BAW implementations is often used for microwave filtering applications in the RF frontend of mobile communications devices. These filters meet the demanding requirements: microwave frequencies (>~500 MHz), low insertion loss, high selectivity, small circuit area, high power handling, high linearity, and low cost.

The traditional AW ladder filter is often preferred because it satisfies these requirements (Morgan 2007). Minor variations to the traditional AW ladder have also been considered for these applications (Taiyo Yuden 2011 etc.), which typically add one or more circuit elements (capacitor, inductor, AW resonator) to the ladder design to enhance a particular circuit feature. This can be done when the influences to the basic AW ladder circuit are minor enough that common computer optimization tools converge. This is a stringent requirement for any circuit containing closely spaced series and parallel resonances like the AW ladder filter, and thus permits only very minor variations to the basic AW ladder design and function.

In the 1920's and 1930's another approach was developed for the design of frequency selective electrical signal filters for communications applications—"network synthesis". This new filter circuit design method was pioneered by Foster and Darlington (Foster 1922, Darlington 1938) in the U.S. and Cauer (Cauer 1933 and 1940) in Germany, among others. In "network synthesis" the desired filter response is translated into a ratio of polynomials, termed a rational function, and a filter circuit is "synthesized" from this function. Neglecting losses, which are kept small in practice, the "synthesized" circuit matches the desired response function. In the 1950's and 1960's, network synthesis was successfully applied to the design of microwave filters for communications and other applications. These new filters utilize high Q (low loss) electromagnetic resonators and electromagnetic couplings between these resonators as circuit elements. (Matthaei 1964, Cameron 2007).

SUMMARY OF THE INVENTION

Here we provide improved design methods and improved circuit designs that yield better performing and/or lower cost microwave acoustic wave filters (i.e. at frequencies >~500 MHz), either fixed frequency and/or tunable filters (tunable in frequency and/or bandwidth and/or input impedance and/or output impedance, which may be frequency dependent, and which may be real or complex valued impedance), and/or impedance matching networks and/or duplexer or multiplexer devices; which may perform circuit functions such as duplexing, impedance matching, signal switching-bandpass filtering and/or bandstop filtering, separately or combined, in single or multiple bands; which may utilize acoustic wave technologies such as surface acoustic wave (SAW), bulk acoustic wave BAW), film bulk acoustic wave (FBAR), microelectromechanical systems (MEMS), etc.; and may be advantageous for applications such as those with demanding electrical and/or environmental performance requirements, and/or such as severe cost and/or size constraints, and such as may be found in the RF frontends of mobile devices such as cellphones, smartphones, laptop computers, tablet computers, etc., or the RF frontends of fixed devices such as M2M devices, or wireless base stations, or satellite communications systems, etc.

The method described herein may utilize circuit elements such as acoustic wave resonators (SAW, BAW, FBAR, MEMS, etc.), as well as capacitors and/or inductors which may or may not be switchable and/or tunable, and/or, switches such as semiconducting or MEMS switches, which may be packaged or unpackaged, which may be incorporated into circuit boards or mounted on circuit boards using surface mount technology or other packaging or mounting, which may be realized monolithically such as on a semiconductor or piezoelectric material in planar form or in hybrid form.

The method may utilize circuit structures such as the in-line non-resonant-node structure (Tsuzuki and Willemsen, 2008-2011 and references therein, defined in the Related Case Statement, above), or others.

Methods for the design of microwave filters comprises comprising preferably the steps of inputting a first set of filter requirements, inputting a selection of circuit element types, inputting a selection of lossless circuit response variables, calculating normalized circuit element values based on the input parameters, and generate a first circuit, insert parasitic effects to the normalized circuit element values of the first circuit, and output at least the first circuit including the post-parasitic effect circuit values. Additional optional steps include: requirements to a normalized design space, performing an equivalent circuit transformation, unmapping the circuit to a real design space, performing a survey, and element removal optimization. Computer implement software, systems, and microwave filters designed in accordance with the method are included.

The method may incorporate the static capacitance, $C_o$, of the acoustic wave resonators into the non-resonant node frequency independent susceptance, $B^N$, of the in-line non-resonant node circuit structure; or into other elements of that circuit structure or other circuit structure.

The method may utilize a frequency domain mapping/unmapping of the filter electrical requirements (such as the insertion loss, return loss, and rejection vs. frequency, requirements which may or may not require tunability and or switchability in any of these quantities, and/or in the input impedance and/or output impedance), to and from a normalized design space where initial lossless circuit solutions may be calculated, such as the square-root/quadratic frequency mapping/unmapping utilized in Modern Filter Theory (Matthaei et al. 1964), or other such frequency mapping/unmapping which may be advantageous for acoustic wave filter design, such as a logarithmic/exponential frequency mapping/unmapping, or other mapping advantageous for addressing the compound nature of the acoustic wave resonator which contains two resonances (the resonance and the anti-resonance). The method may utilize a single frequency mapping or multiple frequency mappings, each at various steps in the design process and may use a different mapping for different pass bands and/or stop bands. The mapping may also normalize the input and output impedances.

The method may also utilize target circuit response functions described by ratios of complex polynomials with real coefficients as well as a scale factor, which may imply finite frequency transmission zeros (TZ's) and/or finite frequency reflection zeros (RZ's), and may also yield other aspects of circuit performance such as complex frequency dependent scattering parameters, such as S21 and S11, among others; and where such target circuit response functions may contain a greater than or equal number of TZ's than RZ's including for any state in the case of a multi-state or tunable device.

The method may utilize circuit synthesis calculations such as coupling matrix methods or parameter extraction methods or others, to obtain an initial lossless normalized circuit which may include a circuit structure and may also include circuit element values.

The method may utilize equivalent circuit transformations on an initial lossless circuit without substantially changing the response of the initial lossless circuit in order to reduce the number of circuit elements or change the type of circuit elements or change the element values of circuit elements to reduce the complexity of the circuit, the size of the circuit, or the realizability of the individual circuit elements. The method may utilize equivalent circuit transformations such as equating a J-inverter to an equivalent capacitive or inductive Pi- or T-network, such as transforming a shunt-resonator/two J-inverter combination to a single series resonator, or transforming a series-resonator/two J-inverter combination into a single shunt resonator, or such as combining multiple parallel capacitances into a single capacitor, or such as removing negative capacitors by combining with positive parallel capacitors to yield a single positive capacitor, or combining multiple series inductors into a single inductor, or removing negative inductors by combining with positive series inductor to yield a single positive inductor, or other equivalent circuit transformations, to obtain a lossless circuit which may have the target circuit response, but may be smaller, less costly, and/or more realizable than the starting initial lossless circuit.

The method may utilize a frequency un-mapping of an initial lossless circuit (which may be the inverse of the frequency mapping used on the filter requirements, and/or the inverses of the multiple frequency mappings utilized during various steps of the design process) to obtain an initial lossless circuit with circuit elements in the real, un-normalized frequency domain; and which may include scale parameters on the circuit element values, and those scale parameters may provide more than one, or a large number, or possibly an infinite number, or possibly many infinities of numbers of choices for specific element values that all may yield the target circuit response, or very close to the target circuit response.

The method may utilize a survey of circuit responses where one or more, or a large number, or a very large number of circuit responses may be calculated using accurate and/or validated circuit models of physical circuit elements such as those which may be used in a filter to be manufactured to meet the filter requirement. The survey of circuit responses may for example, address a) all possible permutations of the ordering of resonator frequencies in the lossless design, b) all realizable values of resonator static capacitances, Co, c) all permutations of positive and or negative values (parities) of J-inverters, and d) other parameters that may be varied in the lossless design that may not change its response function, but may change the response of a realizable circuit with realizable circuit elements having finite resistive losses or other parasitic properties such as parasitic capacitances or inductances or other such parasitic properties. The survey may calculate various aspects of the circuit responses such as a) insertion loss and/or b) return loss and/or c) rejection and/or d) group delay and/or e) node voltages and/or f) branch currents or g) other aspects, either at specific or multiple frequencies in order to evaluate each circuit response against desired performance characteristics in the filter requirement. The survey may yield quantitative or qualitative performance metric values indicating how a specific circuit may perform vs. the filter requirement.

The method may utilize an Element Removal Optimization (ERO) process that may allow a reduction in the number of circuit elements or a change in the type of circuit elements or changes in the values of the circuit elements, and which may allow the resulting circuit to perform better compared to the filter requirement, and/or which may reduce its manufacturing cost, and/or its size, and/or its manufacturability, and/or its performance over temperature, or other such performance metric that is important to meeting the filter requirement or important to the filter application. The ERO may proceed through a systematic series of steps to yield an improved circuit.

The method may produce filter circuit designs that have a wide variation in frequency of the acoustic wave resonators utilized in the design. The variations in resonator frequency of the resonators may exceed the frequency spacing between the resonance and the anti-resonance of the acoustic wave resonators utilized in the design. For example a design may utilize resonators whose spread in frequency is greater than the maximum resonance/anti-resonance spacing of ~4% (in relative frequency) for SAW resonators realized on 42-degree XY cut lithium tantalate crystals.

The method may produce filter circuit designs that have RZ's that lie outside any passband of the filter circuit.

The method may produce filter circuit designs that have a larger or equal number of TZ's than RZ's.

The method may produce filter circuit designs that outperform traditional Mason-type ladder filter designs or lattice filter designs, or variations of such designs For example: computer optimized with added capacitors and/or inductors and/or resonators, in filters used in mobile device RE frontends or other demanding applications, or multiple such filters switched in and/or out of the RF frontend circuitry allowing operation in more than one, or many frequency bands, sequentially or simultaneously.

BRIEF DESCRIPTION OF THE DRAWINGS

FIG. 3 shows the circuit element values used in FIG. 2.

FIG. 6 shows the corresponding circuit values for the circuit shown in FIG. 5.

FIG. 18 shows values for the resonator frequencies and static capacitances $C_o$ are shown in FIG. 18.

DETAILED DES ON OF THE INVENTION

Figure 1:
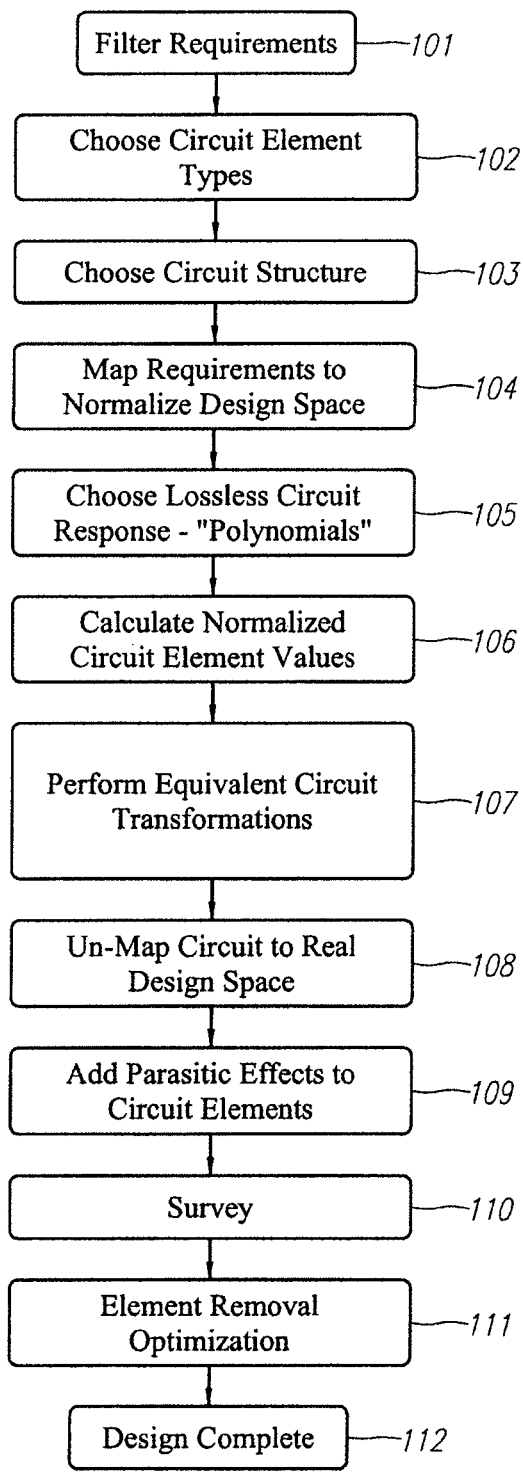
FIG. 1 shows a flow chart delineating the sequence of steps in the filter design method of the invention.

In the following detailed description, reference is made to the accompanying drawings which form a part hereof. As will be apparent to a person of ordinary skill in the art, in the drawings, which are not to scale or to proportion, similar symbols typically identify similar elements, unless context dictates otherwise. The illustrative embodiments described in the detailed description, drawings and claims, are not meant to be limiting. Other embodiments may be used and/or and other changes may be made without departing from the spirit or scope of the present disclosure.

FIG. 1 shows a flow chart delineating the sequence of steps in the filter design method of the invention. Generally each step may be performed at least once in a completed filter design, although any or all of (104), (107), (108), (110), and (111) may or may not be used in a design. The designer may deem an interim result at any point in the process as insufficient to meet the filter requirements and then return to an earlier step, choose a different input at that step, and repeat the sequence of steps again.

The Filter Requirements (101) are established by the application and the user and may include electrical requirements such as frequency dependent return loss, insertion loss, rejection, linearity, noise, input and output impedances, etc.; as well as size and cost requirements, and environmental requirements such as operating temperature range, vibration, failure rate, or others.

Circuit Element Types (102) are chosen such as resonator (SAW, BAW, FBAR, MEMS, etc.), inductor, capacitor, and switch types.

A Circuit Structure is chosen (103) such as in-line non-resonant-node, or in-line, or in-line with cross couplings, or in-line non-resonant-node with cross couplings, or others.

A Mapping/Unmapping may be chosen such as a square-root/quadratic mapping/unmapping (Matthaei et al. 1964), or a logarithmic/exponential mapping/unmapping more suitable to acoustic wave resonators; and the Filter Requirements are mapped to a normalized design space. One attractive logarithmic mapping is shown in Eq. (1), with its inverse=napping in Eq. (2). Other logarithmic/exponential mapping/unmapping combinations may also be utilized. (104)

$$\Omega = \ln\left(\frac{\omega^2}{\omega_p^2}\right) / \ln\left(1 + \frac{1}{\gamma}\right) \qquad \text{Eq. (1)}$$

$$\omega = \omega_p\left(1 + \frac{1}{\gamma}\right)^{\Omega/2} \qquad \text{Eq. (2)}$$

$$|\Omega_R - \Omega_A| = 1 \qquad \text{Eq. (3)}$$

ωp is the geometric center of the passband, ω is the real frequency, Ω is the mapped, normalized frequency, γ is the ratio of the static to the motional capacitance of the acoustic wave resonator A Lossless Circuit Response is chosen (105) in the form of ratios of polynomials, which include TZ's, RZ's, and a scale factor. In general, the number of TZ's may be greater than or equal to the number of RZ's, and often one or more RZ's will lie outside any passband of the filter.

The Mapped and Normalized Circuit Element values are then calculated (106) from these polynomials using coupling matrix or parameter extraction methods or equivalent circuit synthesis methods.

Equivalent circuit transformations may then be performed (107) to reduce the number of circuit elements, or change the type of circuit elements, or change the element values of circuit elements to reduce the complexity of the circuit, the size of the circuit, or the realizability of the individual circuit elements. These transformations do not substantially change the response of the initial lossless circuit. The method may utilize equivalent circuit transformations such as equating a J-inverter to an equivalent capacitive or inductive PI- or T-network, such as transforming a shunt-resonator/two J-inverter combination to a single series resonator, or transforming a series-resonator/two J-inverter combination into a single shunt resonator, or such as combining multiple parallel capacitances into a single capacitor or eliminating the capacitors, or such as removing negative capacitors by combining with positive parallel capacitors to yield a single positive capacitor, or combining multiple series inductors into a single inductor or eliminating the inductors, or removing negative inductors by combining with positive series inductor to yield a single positive inductor, or other equivalent circuit transformations to obtain a lossless circuit which may have the target circuit response, but may be smaller, less costly, and/or more realizable than the starting initial lossless circuit.

If a Mapping was performed in an earlier step then the circuit, circuit elements, and circuit element values are then un-mapped to real frequency space and real element values (108). The Loss of the now real physical circuit elements may be added at this step as well as other parasitic characteristics such as capacitances or inductances (109).

A Survey of calculated circuit responses may be performed (110) where one or more, or a large number, or a very large number of circuit responses is calculated. The survey may address a) all possible permutations of the ordering of resonator frequencies in the lossless design, b) all realizable values of resonator static capacitances, Co, c) all permutations of positive (inductive) and or negative (capacitive) values (parities) of J-inverters, and d) other parameters that may be varied in the lossless design that may not change its response function, but may change the response of a realizable circuit. The survey may calculate one or more of the following aspects of the circuit responses: a) insertion loss, b) return loss, c) rejection, d) group delay, e) node voltages, f) branch currents or g) other aspects, either at specific or multiple frequencies in order to evaluate each circuit response against desired performance characteristics in the filter requirement. The survey may yield quantitative or qualitative performance metric values indicating bow a specific circuit may perform vs. the filter requirement. Circuits with attractive metrics may then be selected.

Element Removal Optimization (ERO) may be performed (111) to reduce the size and cost and/or improve the performance of the final filter design.

Figure 2:
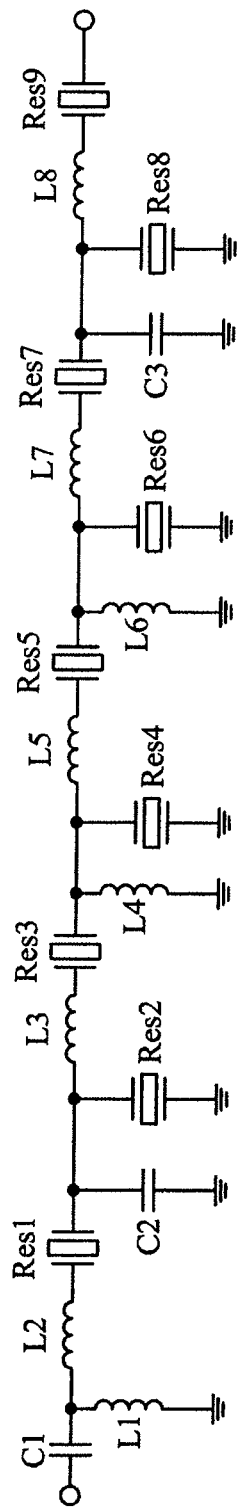
FIG. 2 shows a schematic of a circuit produced using the method shown in FIG. 1.

FIG. 2 shows a schematic of a circuit such as may be used in a mobile device duplexer produced using the method shown in FIG. 1. This design targets the following requirements: one passband from 1850 MHz to 1910 MHz with a maximum insertion loss requirement of 2 dB, three stopbands, one with a frequency range from 1930 MHz to 1990 MHz with a minimum of 44 dB of rejection, one with a frequency range of 2010 to 2025 MHz and the rejection of 20 dB and the third with a frequency range from 2110 MHz to 2155 MHz with a minimum rejection of 45 dB. The piezoelectric substrate chosen for the design is 42-degree XY-cut Lithium Tantalate ($LiTaO_3$). BVD models are used to represent surface acoustic wave (SAW) resonators in this example, computer simulation, and optimization of AW filters and may include elements such as capacitors Cm and CO, inductors Lm.

The Quality factors (Q) model the real loss in the AW resonators, and generally more than one Q factor may be required to describe the loss in an acoustic resonator. Q factors used in this example are: the inductor Lm (901) Q defined as QLm=1000; the capacitor Cm (902) Q defined as QCm=1.0E+8; the static capacitance $C_o$ (903) Q defined as $QC_o$=200; the losses of the metalized bus bars of resonator may be modeled using a resistor in series with the BVD model (not shown) defined as Rs=0.5 ohms. The Quality factors and resistance defined above may be specific to a particular resonator design and materials used to manufacture that design.

Acoustic resonators modeled using the BVD model exhibit both a resonance and an anti-resonance. We may define in general with Equation 4 and Equation 5:

$$\omega_R = \frac{1}{\sqrt{L_m C_m}} \quad (4)$$

$$\frac{\omega_A}{\omega_R} = \sqrt{1 + \frac{1}{\gamma}} \quad (5)$$

where $\omega_R$ and $\omega_A$ may be the resonance and anti-resonance frequencies for a given SAW resonator, and γ (gamma) may depend on a material's property which may be further defined by Equation 6:

$$\frac{C_o}{C_m} = \gamma \quad (6)$$

For this example, the circuit structure chosen (103) is the inline non-resonant node structure (Tsuzuki and Willemsen, 2008-2011 and references therein, defined in the Related Case Statement).

The filter requirements are mapped (104) to a new design space using the logarithmic mapping function shown in Equation 1. The mapping creates the condition where the absolute value of the difference of the mapped resonance ($\Omega_R$) and mapped anti-resonance ($\Omega_A$) equals 1 for one resonator as defined in Equation 3.

A polynomial is chosen (105) to meet the requirements by placing transmission zeros (TZ's) and reflection zeros (RZ's) in the mapped design space. The polynomial for this example exhibits RZ's outside the passband of the filter and a greater number of TZ's than RZ's.

Next, the element values are calculated (106). Elements can now be combined and/or transformed to simplify the circuit and to make the circuit realizable (107).

The circuit is then unmapped (108) back to real frequency space with elements in their respective units.

FIG. 3 shows the circuit element values used in FIG. 2.

Figure 4:
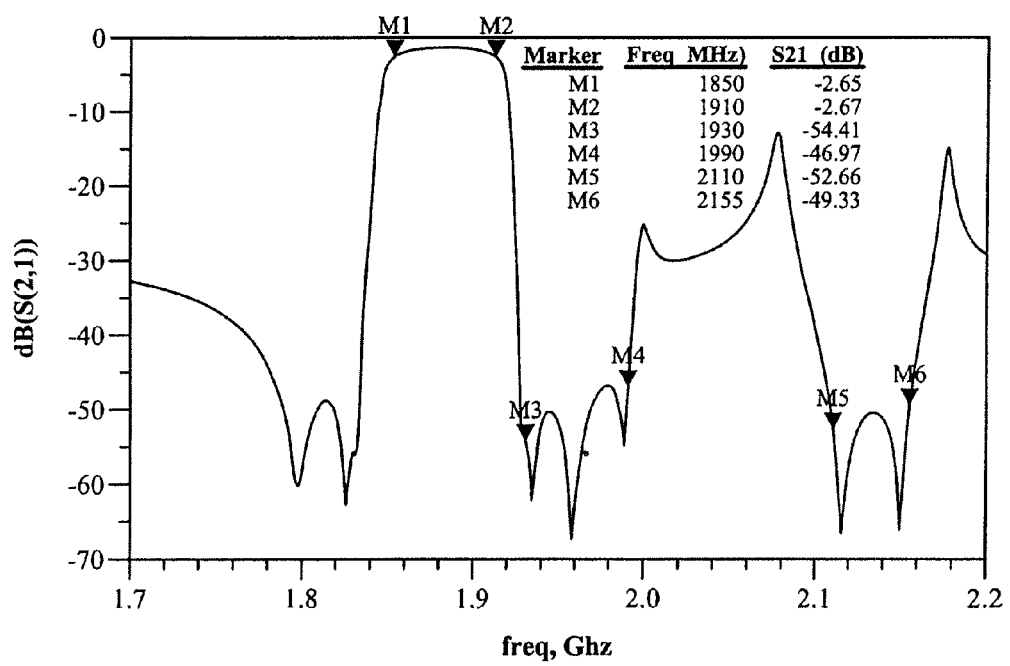
FIG. 4 shows the frequency response of the filter schematic shown in FIG. 2.

FIG. 4 shows the frequency response of the filter schematic shown in FIG. 2. It can be seen in FIG. 4 that one or more of the resonators are widely spaced, that is they are spaced greater in frequency than the frequency difference between the resonance and anti-resonance of a single resonator (about 78 MHz in this example), in this example the spacing between resonators varies between 1 MHz and 260 MHz.

As can be seen in FIG. 4, the maximum passband loss (821 dB) is −2.7 dB, which does not meet the requirement. Parasitics are modeled using an electromagnetic simulator, such as Sonnet Software em, and busbar losses are added (Rs).

Equivalent circuit transformations (107) can be applied and elements can be combined and/or eliminated to further simplify the circuit. In this example, equivalent circuit transformations were performed to transform shunt resonators and two J-inverters into single series resonators.

Figure 5:
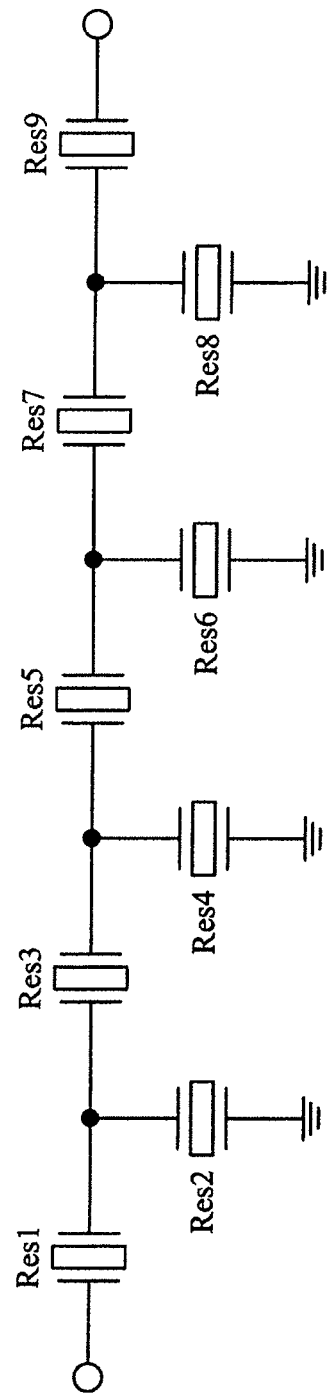
FIG. 5 shows a circuit after the element replacement optimization (ERO) step.
Figure 7:
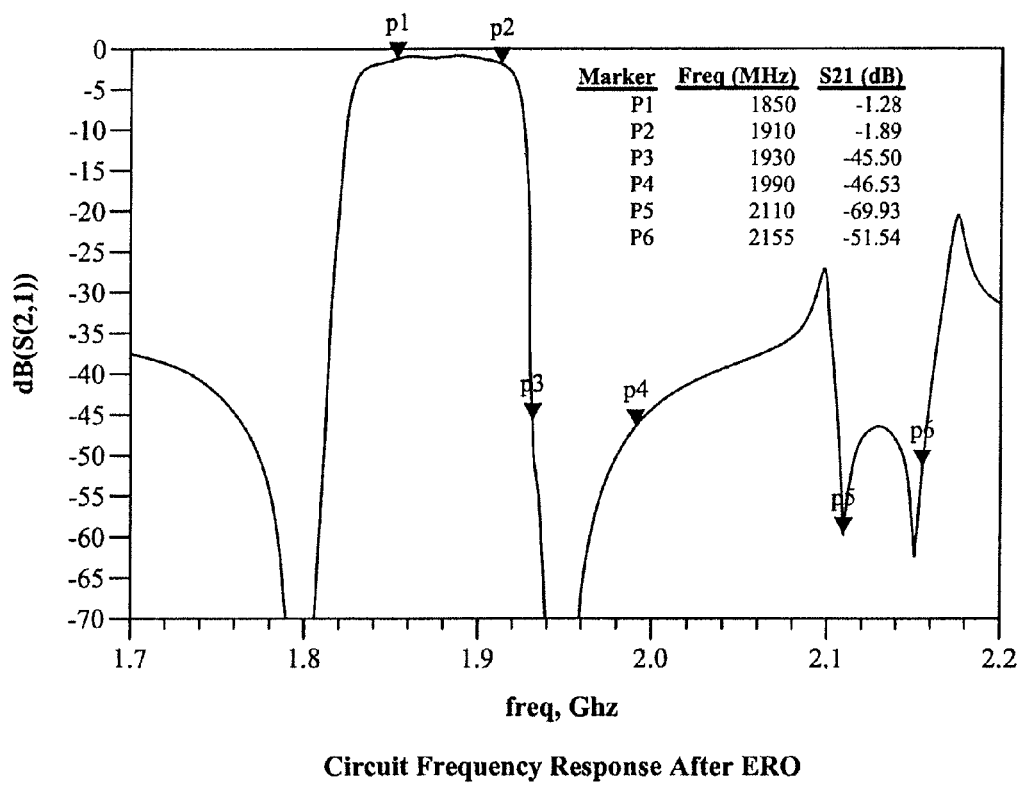
FIG. 7 shows the filter frequency response of the schematic of FIG. 5 with a maximum passband loss (S21 dB) of −1.89 dB, minimum rejection between 1930 MHz and 1990 MHz of 45.5 dB and minimum rejection between 2110 MHz and 2155 MHz of −46.54 dB.

ERO (111) ("Element Removal Optimization n Microwave Filters", filed on Mar. 15, 2013, hereby incorporated by reference as if fully set forth herein) is performed using simulation software such as Agilent ADS to meet the specifications and further simplify the circuit. The resulting circuit schematic is shown in FIG. 5 and corresponding circuit values are shown in FIG. 6. The filter frequency response of the schematic FIG. 5 and values FIG. 6 is shown in FIG. 7 with a maximum passband loss (S21 dB) of −1.89 dB, minimum rejection between 1930 MHz and 1990 MHz of −45.5 dB and minimum rejection between 2110 MHz and 2155 MHz of −46.54 dB. This response meets the target requirements.

$$\text{The percentage separation is} = \sqrt{1+1/\gamma} - 1 \quad \text{Eq. (7)}$$

The percentage separation of an acoustic wave resonator is the percentage frequency separation between the resonant and anti-resonant frequencies as shown in Eqn. (7). In this example, $\gamma=12$, the percentage separation is about 4.1% and the difference between resonant and anti-resonant frequencies (the separation) of a single resonator is about 77 MHz and is the resonant frequency times the percent separation. The frequency difference between the highest and lowest resonator in the design represented in FIGS. 5-7 is 260 MHz or 3.4 times the average resonator separation. The average frequency difference all possible pairs of resonators is more than 0.75 times the average resonator separation, or more than 1 times the average resonator separation, or more than 1.254 times the average resonator separation or more. In this example the average frequency difference between all possible pairs of resonators is approximately 1.4 times the average resonator separation. The square root of the variance of the difference between the resonant frequencies of pairs of resonators is 85 MHz or 1.1 times the average resonator separation. The frequency separations between 15 of the total 32 possible pairs of resonators exceed the average resonator separation.

Figure 8A:
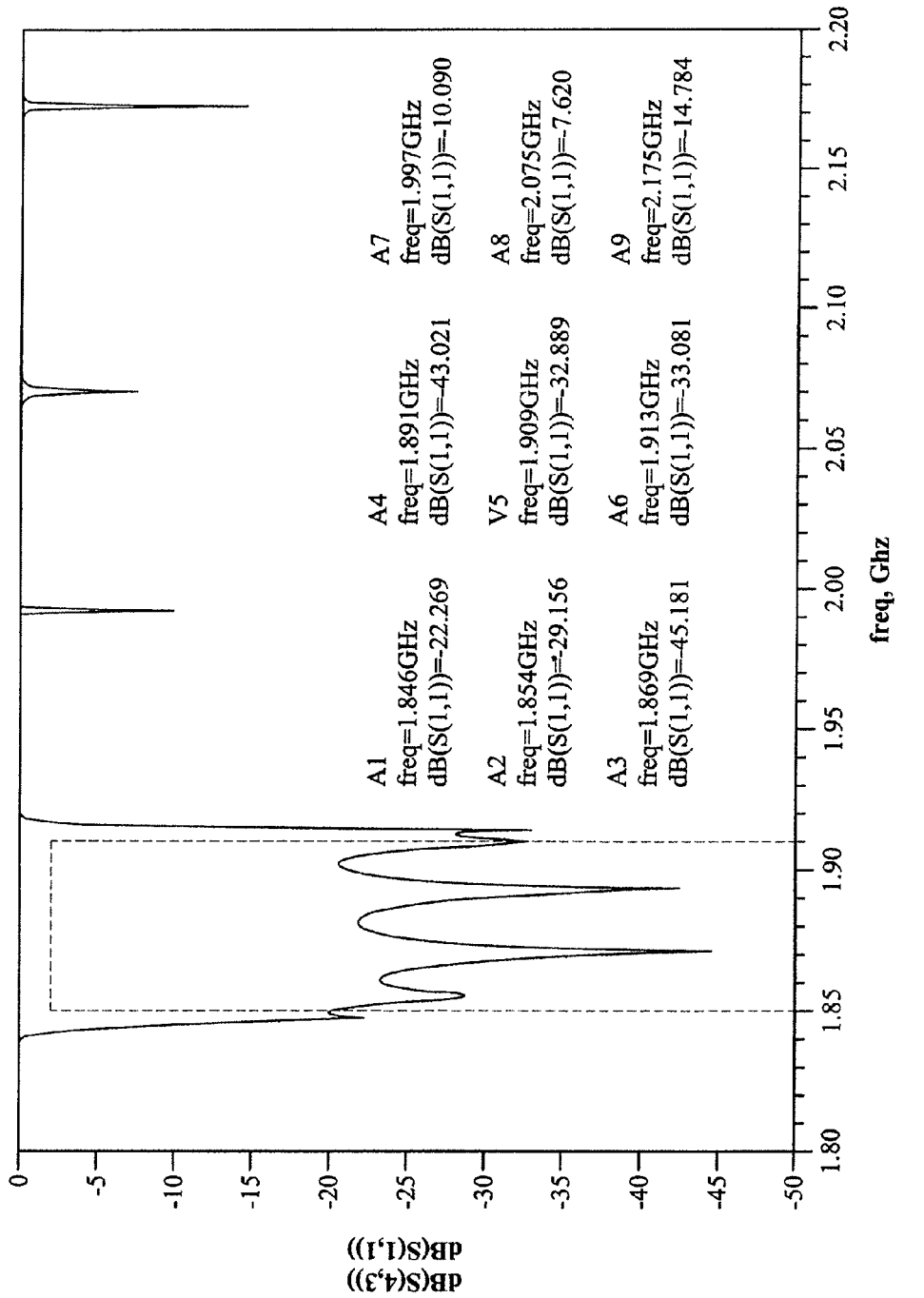
FIG. 8a shows the S11 for the circuit shown in FIG. 2 (but without loss).
Figure 8B:
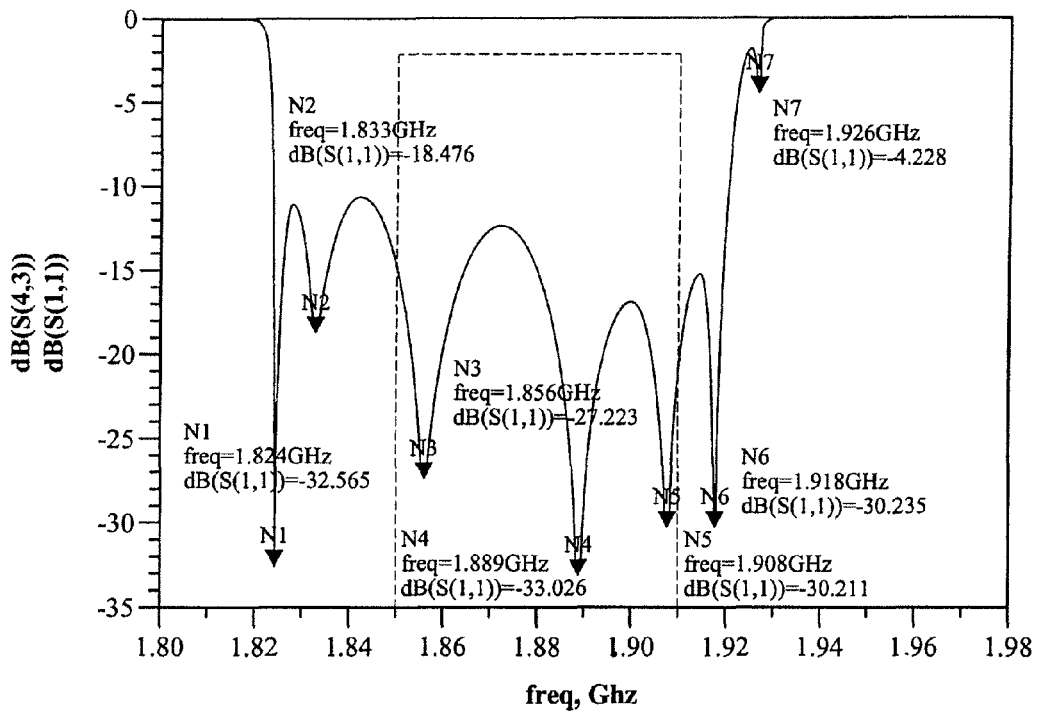
FIG. 8b shows the S11 for the circuit shown in FIG. 5 (without loss).
Figure 8B:
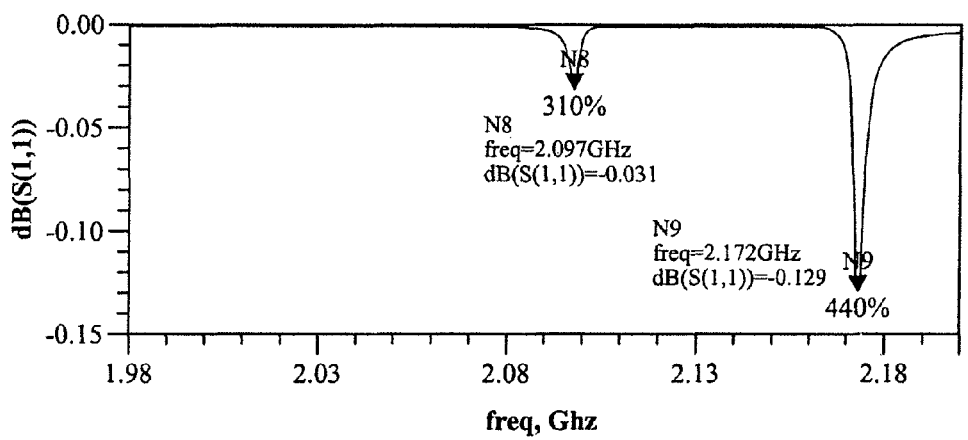

RZ's occur at frequencies where the local return loss (and/or S11) minima and local insertion loss (and/or S21) maxima coincide to within less than about 5% of the percentage separation, less than about 4 MHz for this example. FIG. 8a shows the S11 for the circuit shown in FIGS. 2, 3 (without loss) and FIG. 8b shows the S11 for the circuit shown in FIGS. 5, 6 (without loss). As can be seen from FIGS. 8a and 8b, RZ's are located outside and far from the passband. RZ's are located far from the passband, for instance more than the average resonator separation up to 3.4 times the average resonator separation from the edge of the nearest passband and/or not contiguous with the region formed by other RZ's and/or on the other side of a stopband from the passband and/or falling near a stopband. For this example, RZ's are located up to 3.4 times the average resonator separation from the passband edge. The passband for this example is 60 MHz wide. Relative to a passband width, RZ's as shown in FIG. 8b are 43.3% and 28.3% below the lower edge of the passband and 26.7% and 13% above the upper edge of the passband and are contiguous with the other RZ's in the passband. Also, two RZ's are not contiguous with the passband RZ's and are 310% and 440% above the upper edge of the passband.

Figure 9:
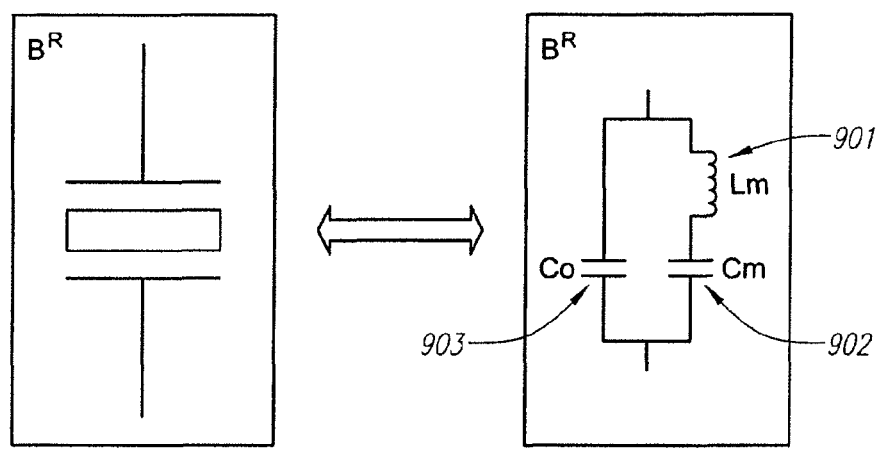
FIG. 9 shows the equivalent circuit for an AW resonator using the Butterworth-van Dyke (BVD) model.

FIG. 9 shows the equivalent circuit for an AW resonator, the Butterworth-van Dyke (BVD) model. This compound resonator consists of a series capacitor (Cm) (902), a series inductor (Lm) (901) and a parallel capacitance ($C_o$) (903). This model has a resonant frequency (fr) and an antiresonant frequency (far) that are closely spaced, and AW filters must incorporate the additional $C_0$ element that does not appear in electromagnetic microwave resonators.

Figure 10:
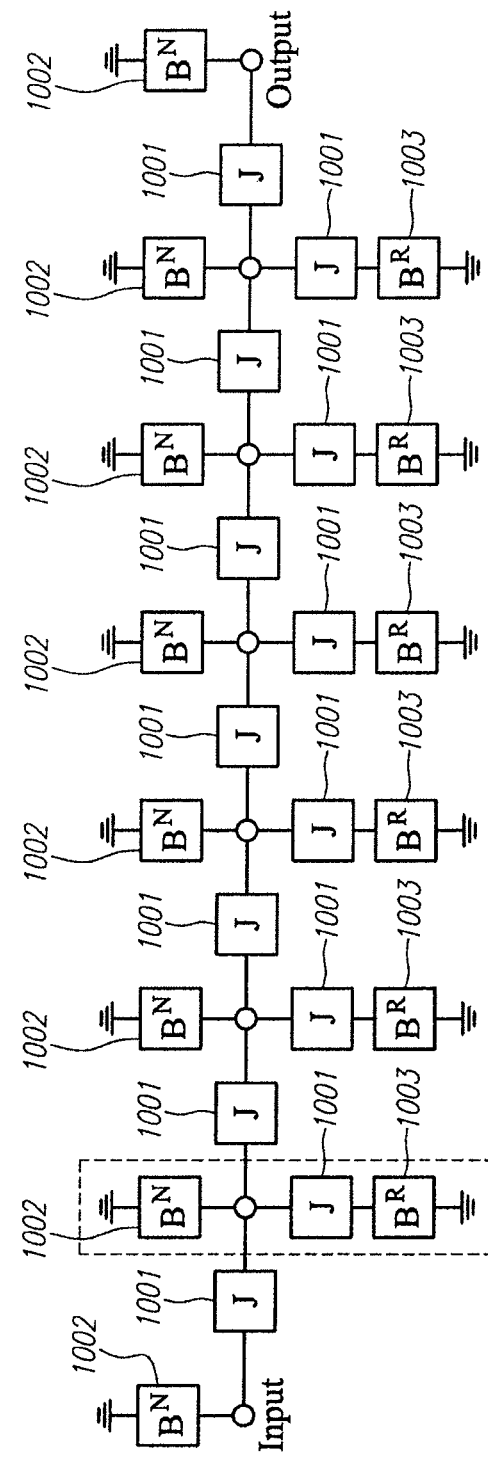
FIG. 10 presents the inline non-resonant-node structure consisting of admittance inverters (J), non-resonant elements ($B^N$) and resonant elements ($B^R$).
Figure 11:
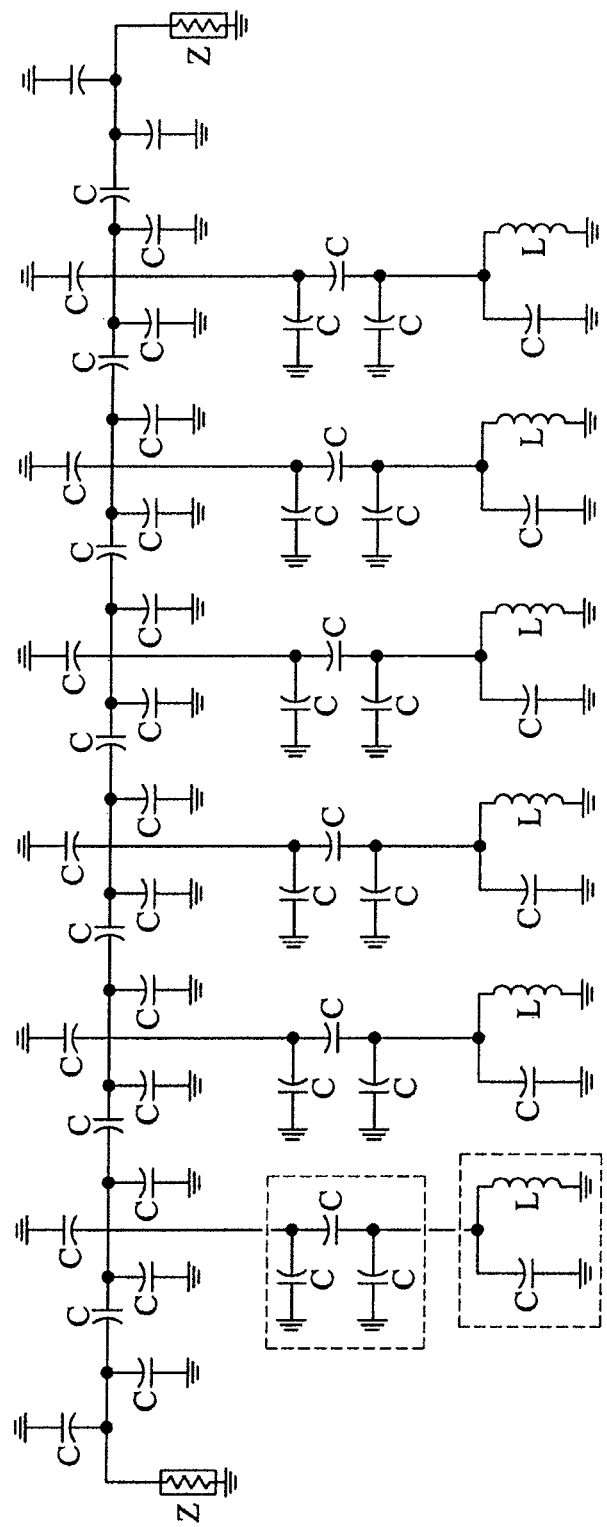
FIG. 11 shows circuit elements of a resonator.

FIG. 10 presents the inline non-resonant-node structure (for example see Tsuzuki & Willemsen, 2008-2011 and references therein, see the Related Case Statement) consisting of admittance inverters (J) (1001), non-resonant elements ($B^N$) (1002) and resonant elements ($B^R$)(1003). This circuit structure is useful for network synthesis of reconfigurable bandpass filters, provided that the high Q-factor resonators used to realize $B^R$ values are well described by a parallel L-C equivalent circuit. A challenge arises if the high Q-factor resonators are better described by the BVD model. This resonator cannot be used directly in the circuit of FIG. 11 to realize a $B^R$ element because of the additional $C_0$.

Figure 12:
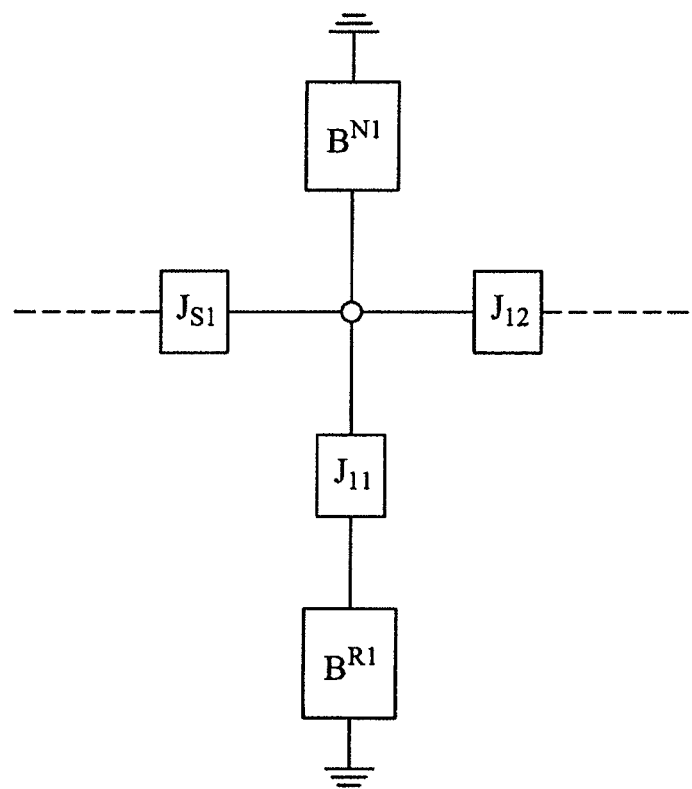
FIG. 12 shows one part of the inline non-resonant-node structure of FIG. 10.
Figure 13:
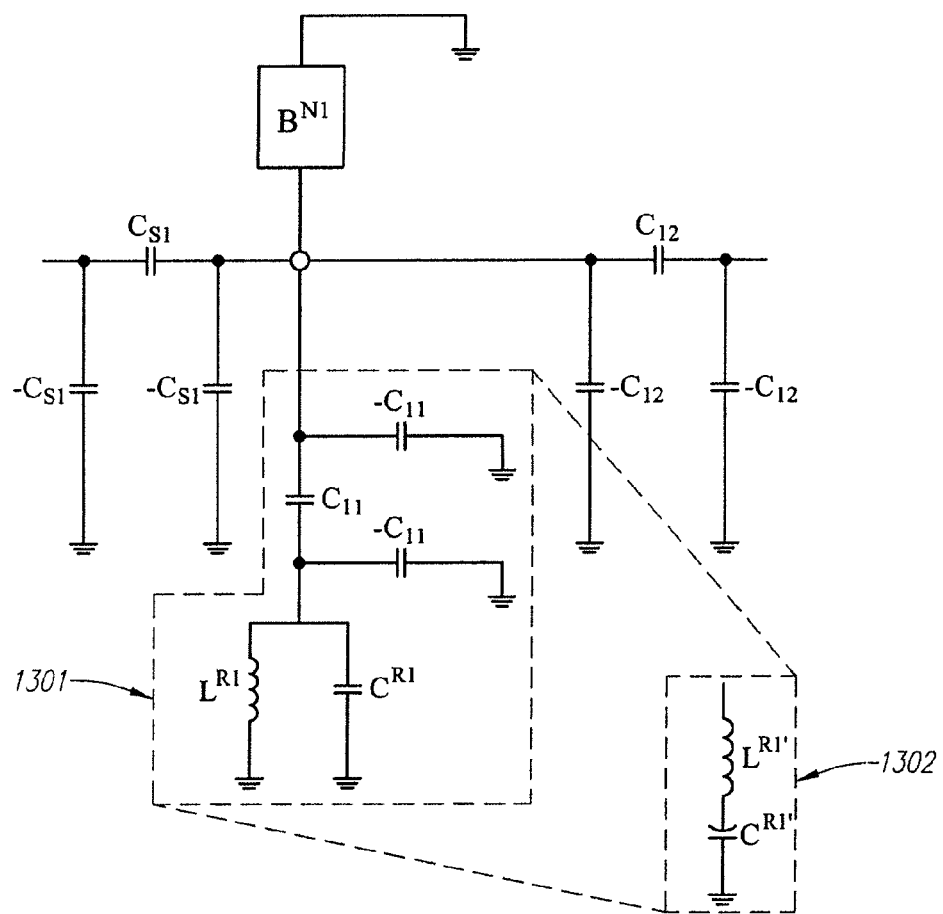
FIG. 13 shows the mapped J and B values can being unmapped to lossless circuit elements (L's and C's) at real frequencies.

FIG. 12 shows one part of the inline non-resonant-node structure of FIG. 10. This may contain three different J-inverters (JS1, J11, J12), one resonator ($B^{R1}$) and one non-resonant element ($B^{N1}$). Each of these element values is generated by calculating a coupling matrix that satisfies this combination of topology and a chosen polynomial filter response function. These mapped J and B values can be unmapped to lossless circuit elements (L's and C's) at real frequencies, as shown in FIG. 13. Note that any B can be realized by either an L or a C depending on the sign of B.

Figure 14:
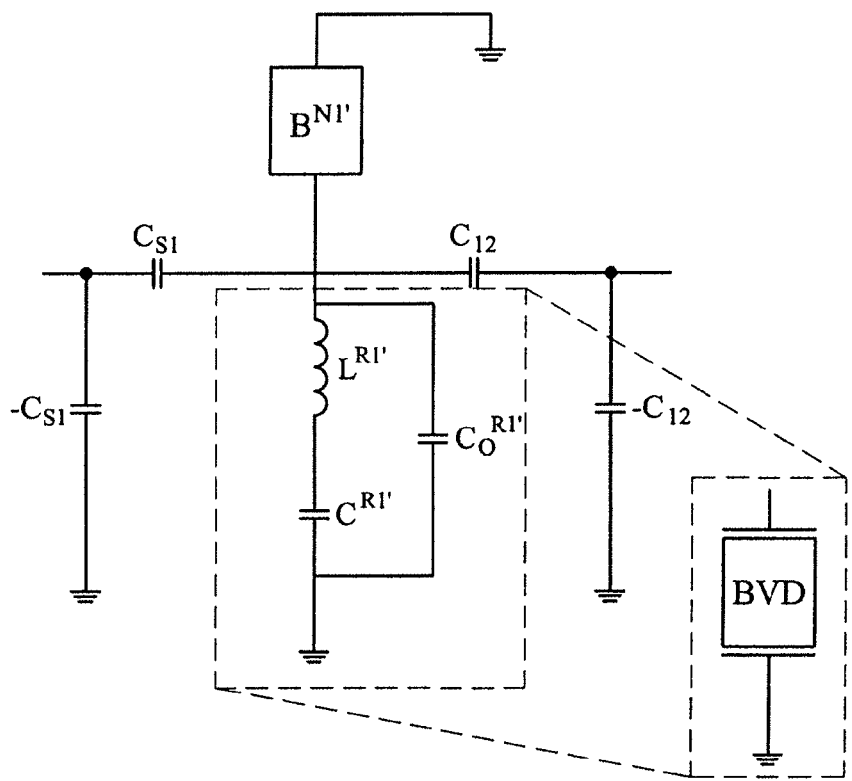
FIG. 14 shows the circuit subject to the transformation.

The entire shunt leg (1301) in FIG. 13 shows a parallel resonator connected to the main circuit path via a J-inverter, and its replacement by an equivalent series L-C resonator (1302). Next, the series L-C resonance that the circuit requires can be realized with the series resonance of a BVD resonator, if we can accommodate the static capacitance. This is accomplished by replacing three capacitances ($-C_{s1}, -C_{12}$, and $C^{N1}$) with a capacitance and a susceptance ($C_0^{R1'}$ and $B^{N1'}$). $C_0^{R1'}$ is the value of the static capacitance of the resonator and $B^{N1'}$ is given by $B^{N1'}=B^{N1}-\omega(C_{s1}+C_{12}+C_0^{R1})$. The circuit with this transformation is shown in FIG. 14. Note that this element combination may be done at an earlier stage of the process by combining and B element values in anticipation of the desired final circuit elements.

Figure 15:
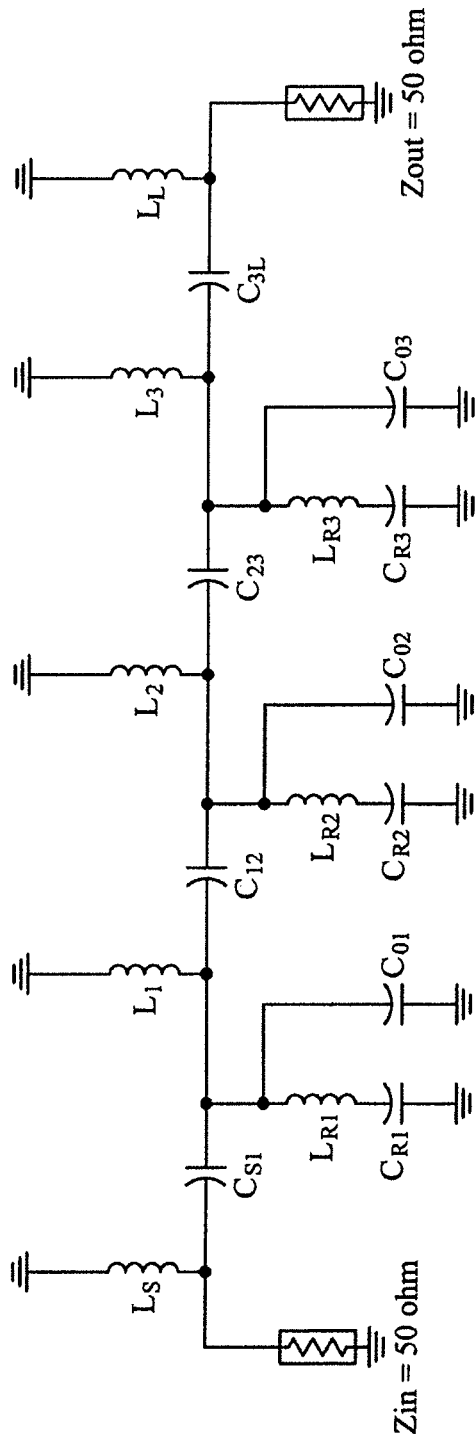
FIG. 15 present a lossless circuit model for a realization of a reconfigurable three SAW resonator bandpass filter.
Figure 16A:
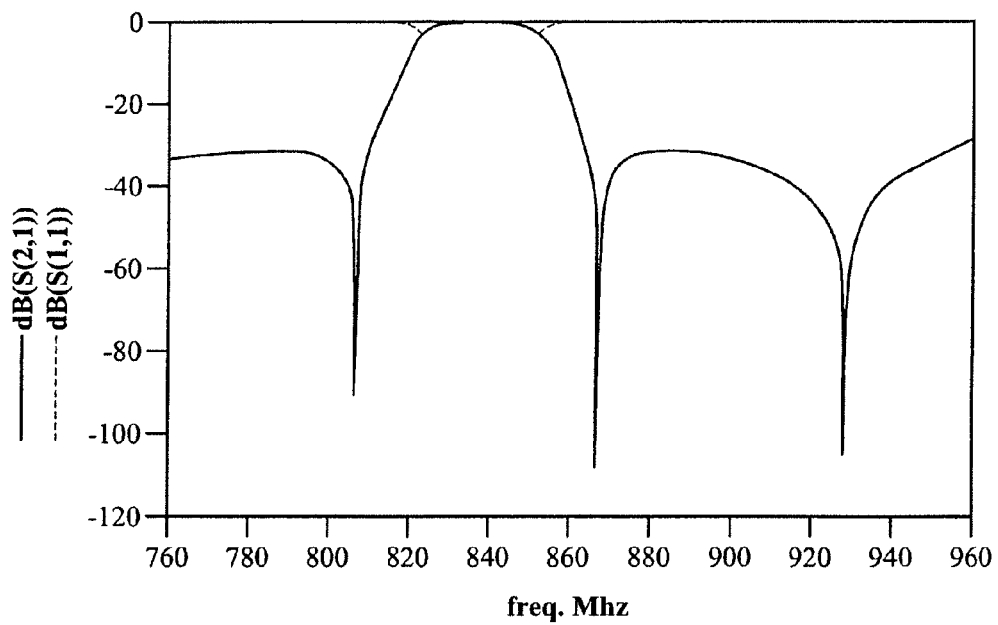
FIGS. 16a and 16b show the calculated lossless filter response S21 for the Low State and High State, respectively.
Figure 16B:
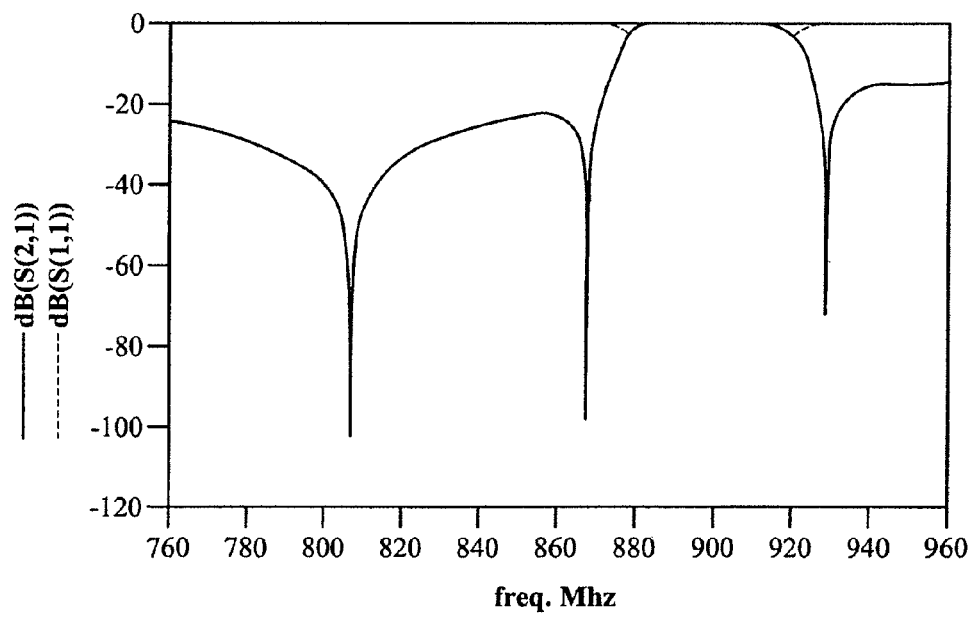

FIG. 15 present a lossless circuit model for a realization of a reconfigurable three SAW resonator bandpass filter designed using the network synthesis method according to the method just described. The BVD models in this example have gamma value of 12 which may be a reasonable value for 42° cut XY-cut LiTaO₃. Note that this simple circuit has not undergone the ECT (107) nor the ERO (111) steps of FIG. 1. This filter was designed to be reconfigurable between two passbands centered at either 836.5 MHz (Low State, Band 5 uplink center) or 897.5 MHz (High State, Band 8 uplink center). This circuit consists of three shunt SAW resonators represented by BVD models that produce three TZ's in S21. The reconfiguring between Low and High States is achieved by altering the values of the series elements between the resonators (in this example: CS1, C12, C23, C3L) and the shunt elements that are not resonators (in this example: LS, L1, L2, L3, LL). FIGS. 16a and 16b show the calculated lossless filter response S21 for the Low State and High State respectively. The three TZ's evident in S21 in both figures occur at the same frequencies in the low state and the high state, and are produced by the resonant frequencies fr of the three shunt SAWs. In general, the circuit may now be optimized using a circuit simulation software package such as Agilent's ADS.

Figure 17:
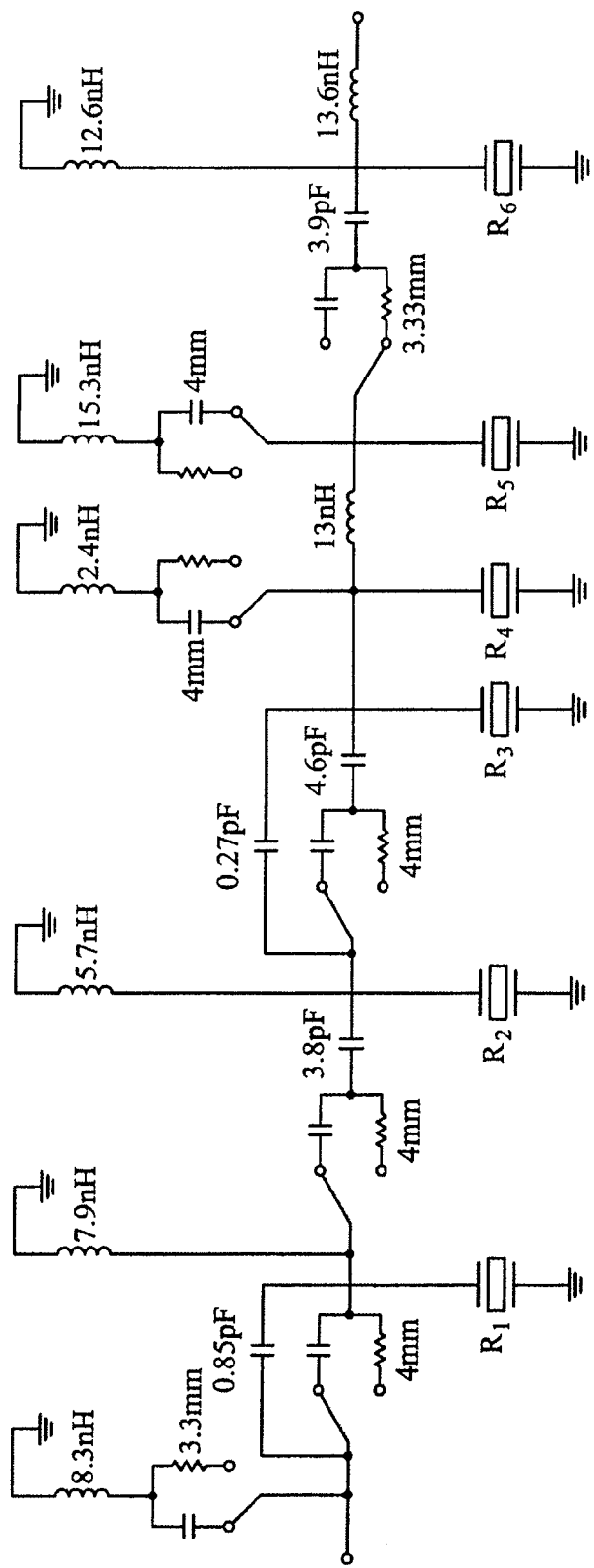
FIG. 17 shows a schematic representation of one embodiment.

FIG. 17 shows a schematic representation of one embodiment such as may be used as part of a tunable or reconfigurable duplexer used in a mobile device RF front-end, and may provide impedance matching to the power amplifier and/or the antenna, and/or the low noise amplifier in a mobile device RF front-end. A tunable/switched/reconfigurable filter using fixed SAW resonators is disclosed. Following is a sequence used to produce the circuit.

The requirement (101) is for a two state filter that can be re-configured to either state by setting the position of switches. In the first state, called band 5, the filter passes frequencies between 824 MHz and 849 MHz with less than 3.5 dB insertion loss and rejects frequencies between 869 MHz and 894 MHz by at least 40 dB. In the second state, called band 8, the filter passes frequencies between 880 MHz and 915 MHz and rejects frequencies between 925 MHz and 960 MHz by at least 40 dB.

Circuit elements and types for this example (102) are, SAW resonators are modeled assuming 15 deg Y cut $LiNbO_3$. Losses used for this resonator are $QLm=3,000$, $QC_o=140$ and $Rs=0.5$ Ohms. Inductors with $Qu=60$ and Capacitors with $Qu=200$, and switches with 3 pF/mm gatewidth & 1.0 Ohm*mm gatewidth are selected as the building block elements. Switches may be implemented using any compatible technology used to fabricate high quality RF switches, including, but are not limited to, semiconductor switches such as GaAs, Si, Silicon on Sapphire (SOS), SiGe, Silicon on Insulator (SOD or MEMS switches.

The normalized design space prototype circuit chosen (103) is shown in FIG. 10.

A mapping may be chosen (104), in this example the mapping is shown in equation 1.

Two different lossless responses are chosen to meet the requirements (105) for band 5 and band 8 respectively. The location of the six TZ's are common between the two bands, but different RZ's are chosen for each band. For band 5 three RZ's are chosen, for band 8 five RZ's are chosen.

Many different embodiments of the lossless responses are calculated, unmapped (108) using equation 2, and realized. Loss is added to correspond to the real losses expected from each component. The results are then surveyed (compared) in terms of important performance parameters, in this example, Insertion loss, commonality of component type, and commonality of component value. Pairs of circuits (one band 5 and one band 8) are produced with each possible ordering of frequencies of the resonators, each possible parity of the J inverters (inductive or capacitive), and a selection of $C_o$, values for the resonators. Then circuit performance parameters are calculated. In this example all possible resonator frequency orderings, all possible parities, and the range of practical $C_o$ values of 0.95, 1.9, 3.8, and 7.6 pF are used to calculate insertion loss at the passband center frequency for every design. One pair of designs (one band 5 and one band 8 with the same resonator order and $C_o$ values) is then selected.

Figure 19:
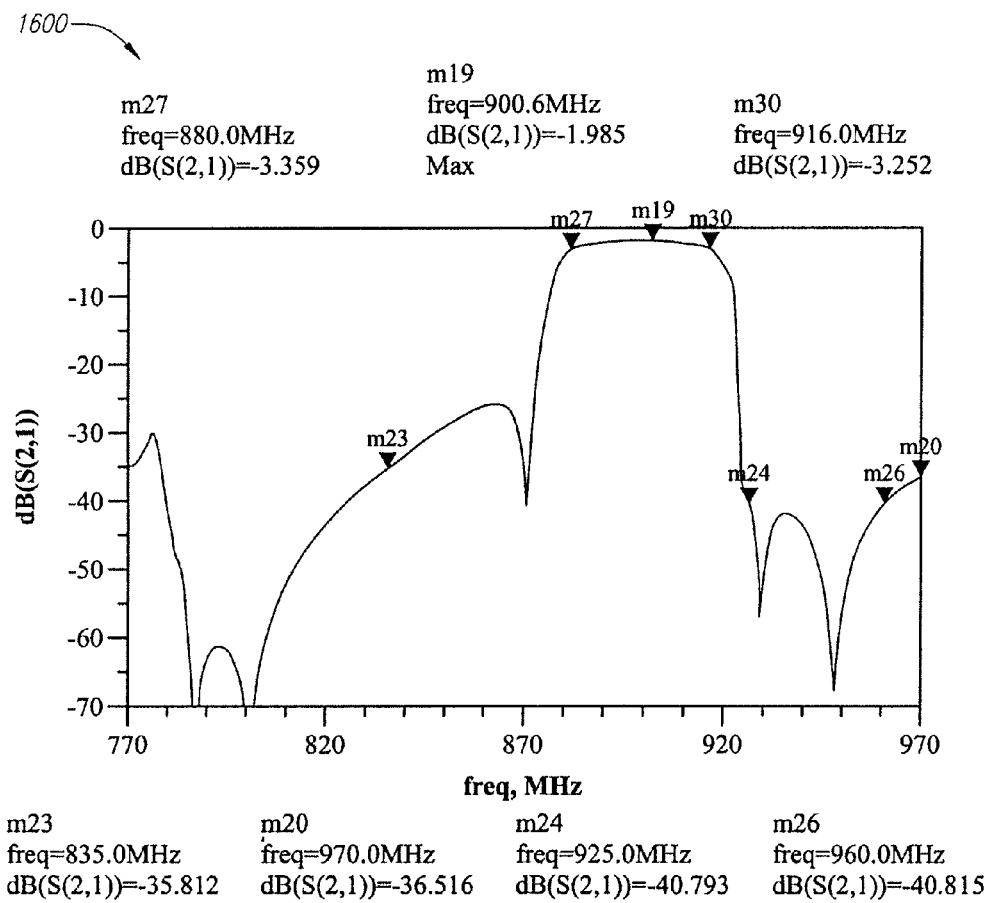
FIG. 19 is a graph of the response for the circuit set to band 5 is shown in FIG. 19
Figure 20:
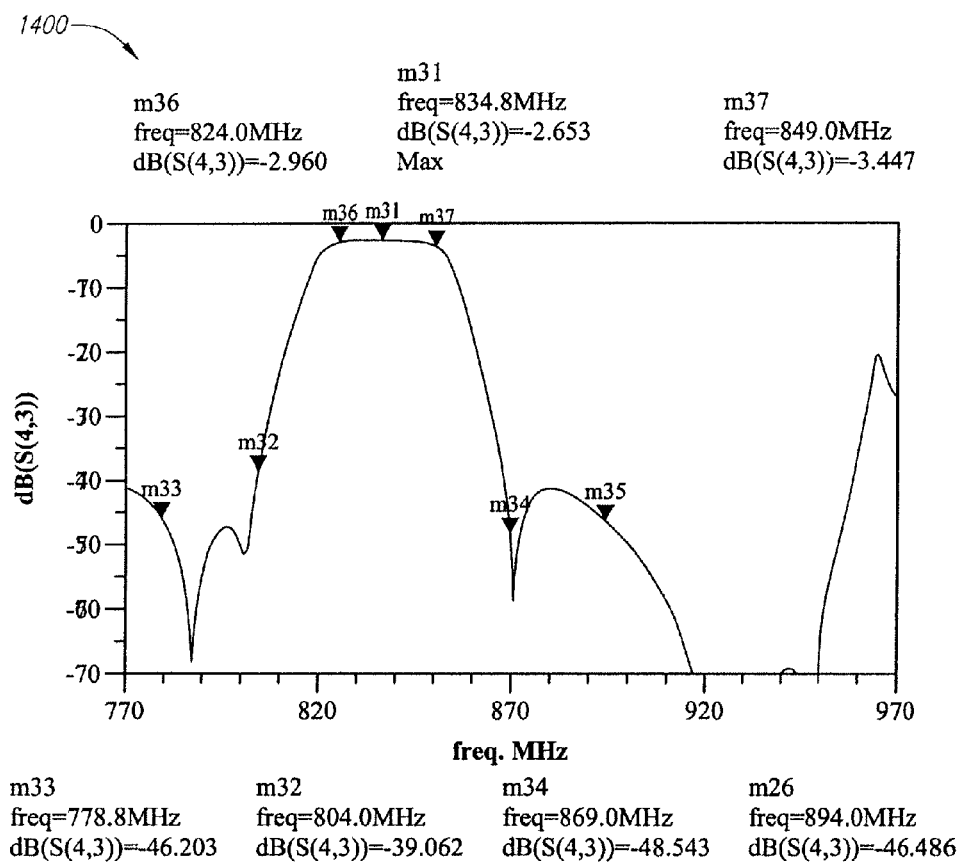
FIG. 20 is a graph of the response for the circuit set to band 8 is shown in FIG. 20.

Element removal optimization (111) ("Element Removal Optimization n Microwave Filters", filed on Mar. 15, 2013, hereby incorporated by reference as if fully set forth herein) is then performed on the selected design pair. Switches are added to each branch where the impedance is different between the two bands thus creating a single circuit from the two separate designs. The gatewidth of each switch, value of an inductor or capacitor (if needed) and the circuit configuration of the branch is selected so that the impedance of a given branch will be the required band 5 impedance in one switch state and the required band 8 impedance in the other switch state. ERO (111) is then repeated on the combined circuit. The resulting circuit schematic is shown in FIG. 17 with the switches set for band 5 operation (all switches set to the other position will set the circuit for band 8 operation. Values for the resonator frequencies and static capacitances $C_o$ are shown in FIG. 18. The response for the circuit set to band 5 is shown in FIG. 19, and the response for the circuit set to band 8 is shown in FIG. 20.

Computer implement software, systems, and microwave filters designed in accordance with the method are also included. Any suitable form of server, computer or processor may be used to implement the method. Associated memory may be used to store the software used in association with the server, computer or processor.

All publications and patents cited in this specification are herein incorporated by reference as if each individual publication or patent application were specifically and individually indicated to be incorporated by reference. Although the foregoing invention has been described in some detail by way of illustration and example for purposes of clarity and understanding, it may be readily apparent to those of ordinary skill in the art in light of the teachings of this invention that certain changes and modifications may be made thereto without departing from the spirit or scope of the following claims.

REFERENCES

Liang et al. HTS Microstrip filters with multiple symmetric and asymmetric prescribed transmission zeros In: IEEE Trans. Microwave Theory Tech., Sunnyvale, Calif.: IEEE, 1999, vol. 4, p. 1551-1554 (4 pages).

S. Amari, Synthesis of Cross-Coupled Resonator Filters Using an Analytical Gradient-Based Optimization Technique, IEEE Trans. Microwave Theory and Technique, vol. 48, No. 9, pp. 1559-1564, September 2000.

G. L. Hey-Shipton, Efficient Computer Design of Compact Planar Band-Pass Filters Using Electrically Short Multiple Coupled Lines, 1999 IEEE MTT-S Int. Microwave Symp. Dig., June 1999 (4 pages).

G. Tsuzuki, Superconducting Filter for IMT-2000 Band, IEEE Trans. Microwave Theory & Techniques, vol. 48, No. 12, pp. 2519-2525, December 2000.

J. S. Hong, et al., Microstrip Filters for RF/Microwave Applications, John Wiley & Sons, Inc. (241 pages) (2001).

R. Wu, et al., New Cross-Coupled Microstrip Band Reject Filters, Microwave Symposium Digest, 2004 IEEE MTII-S Digest, International vol. 3, 6-11, pp. 1597-1600 June 2004.

Dahm, Thomas, et al., Analysis and Optimization of Intermodulation in High-Tc Superconducting Microwave Filter Design, IEEE Transactions on Applied Superconductivity, vol. 8, No. 4, December, 1998, pp. 149-157.

Intermodulation Distortion (IMD) Measurements Using the 37300 Series Vector Network Analyzer, Anritzu Microwave Measurements Division, September 2000, Rev. A. (12 pages).

Application Note Intermodulation Distortion, An Insight Intermodulation Distortion Measurement Methods Using the IFR2026A/B Multisource Generator, www.aeroflex.com, Part No. 46891/846, Issue 2, May 2004 (12 pages).

Amari et al., In-Line Pseudoelliptic Band-Reject Filters with Nonresonating Notes and/or Phase Shifts, IEEE Transactions on Microwave Theory and Techniques, 2006, (9 pages). cited by other

We claim:

1. A non-transitory machine readable medium containing instructions that, which when executed by a computer, implements a method for the design of a microwave filter, comprising the steps of:

inputting a set of filter requirements;

inputting a selection of circuit element types;

inputting a selection of lossless circuit response variables;

calculating normalized circuit element values based on the inputted set of filter requirements, circuit element types, and lossless circuit response variables;

generating a circuit comprising the calculated normalized circuit element values;

inserting parasitic effects in the normalized circuit element values of the circuit; and outputting at least the circuit including the post-parasitic effect circuit values.

2. The machine readable medium of claim 1, wherein when the instructions are executed by the computer, further comprises the step of mapping the set of requirements to a normalized design space.

3. The machine readable medium of claim 1, wherein when the instructions are executed by the computer, further comprises the step of performing an equivalent circuit transformation on the circuit.

4. The machine readable medium of claim 2, wherein when the instructions are executed by the computer, further comprises the step of unmapping the circuit to a real design space.

5. The machine readable medium of claim 1, wherein when the instructions are executed by the computer, further comprises the step of performing a survey on the circuit.

6. The machine readable medium of claim 1, wherein when the instructions are executed by the computer, further comprises the step of element removal optimization on the circuit.

7. The machine readable medium of claim 1, wherein the filter requirements are at least selected from the group comprising: frequency dependent return loss, insertion loss, and linearity.

8. The machine readable medium of claim 1, wherein the circuit element type is a resonator.

9. The machine readable medium of claim 8, wherein the resonator is a surface acoustic wave (SAW) resonator.

10. The machine readable medium of claim 1, wherein when the instructions are executed by the computer, further comprises inputting a selection of circuit structures, wherein the normalized circuit element values are further based on the inputted circuit structure, and wherein the inputted circuit structure is in-line non-resonant-mode.

11. The machine readable medium of claim 4, wherein the mapping/unmapping is square-root/quadratic mapping/unmapping.

12. The machine readable medium of claim 5, wherein the survey calculates multiple circuit responses.

13. A system, comprising:
a processor; and
memory storing computer readable software, which when executed by the processor, implements a method for the design of a microwave filter, comprising the steps of:
inputting a set of filter requirements;
inputting a selection of circuit element types;
inputting a selection of lossless circuit response variables;
calculating normalized circuit element values based on the inputted set of filter requirements, circuit element types, and lossless circuit response variables;
generating a circuit comprising the calculated normalized circuit element values;
inserting parasitic effects in the normalized circuit element values of the circuit; and
outputting at least the circuit including the post-parasitic effect circuit values.

14. The system of claim 13, wherein the computer readable software, when executed, further comprises the step of mapping the set of requirements to a normalized design space.

15. The system of claim 13, wherein the computer readable software, when executed, further comprises the step of performing an equivalent circuit transformation on the circuit.

16. The system of claim 14, wherein the computer readable software, when executed, further comprises the step of unmapping the circuit to a real design space.

17. The system of claim 13, wherein the computer readable software, when executed, further comprises the step of performing a survey on the circuit.

18. The system of claim 13, wherein the computer readable software, when executed, further comprises the step of element removal optimization on the circuit.

19. The system of claim 13, wherein the filter requirements are at least selected from the group comprising: frequency dependent return loss, insertion loss, and linearity.

20. The system of claim 13, wherein the circuit element type is a resonator.

21. The system of claim 20, wherein the resonator is a surface acoustic wave (SAW) resonator.

22. The system of claim 13, wherein the computer readable software, when executed, further comprises inputting a selection of circuit structures, wherein the normalized circuit element values are further based on the inputted circuit structure, and wherein the inputted circuit structure is in-line non-resonant-mode.

23. The system of claim 16, wherein the mapping/unmapping is square-root/quadratic mapping/unmapping.

24. The system of claim 17, wherein the survey calculates multiple circuit responses.

* * * * *